(12) United States Patent
Abe et al.

(10) Patent No.: US 9,845,392 B2
(45) Date of Patent: Dec. 19, 2017

(54) HARD COATING, METHOD FOR MANUFACTURING SAME, AND HARD-COATED ARTICLE

(71) Applicant: KOBE STEEL, LTD., Kobe-shi (JP)

(72) Inventors: Maiko Abe, Kobe (JP); Kenji Yamamoto, Kobe (JP)

(73) Assignee: Kobe Steel, Ltd., Kobe-shi (JP)

(*) Notice: Subject to any disclaimer, the term of this patent is extended or adjusted under 35 U.S.C. 154(b) by 0 days.

(21) Appl. No.: 14/764,251

(22) PCT Filed: Feb. 10, 2014

(86) PCT No.: PCT/JP2014/053104
§ 371 (c)(1),
(2) Date: Jul. 29, 2015

(87) PCT Pub. No.: WO2014/132790
PCT Pub. Date: Sep. 4, 2014

(65) Prior Publication Data
US 2015/0361269 A1    Dec. 17, 2015

(30) Foreign Application Priority Data

Feb. 27, 2013 (JP) .................. 2013-037449

(51) Int. Cl.
| | |
|---|---|
| C23C 14/34 | (2006.01) |
| C09D 1/00 | (2006.01) |
| C23C 14/08 | (2006.01) |
| C23C 14/32 | (2006.01) |
| C23C 30/00 | (2006.01) |
| C23C 28/04 | (2006.01) |

(52) U.S. Cl.
CPC ............. C09D 1/00 (2013.01); C23C 14/08 (2013.01); C23C 14/325 (2013.01); C23C 14/34 (2013.01); C23C 28/042 (2013.01); C23C 30/005 (2013.01); *B23B 2228/10* (2013.01)

(58) Field of Classification Search
USPC .......... 51/307, 309; 428/697, 698, 699, 701, 428/702, 704; 204/192.1, 192.15, 192
See application file for complete search history.

(56) References Cited

U.S. PATENT DOCUMENTS 7,018,727 B2 * 3/2006 Dzick ................. C03C 17/3417
                                                                  428/699
2010/0215975 A1  8/2010 Yamamoto et al.

FOREIGN PATENT DOCUMENTS

| DE | 20 2004 011 430 U1 | | 10/2004 |
|---|---|---|---|
| EP | 2298954 | * | 3/2001 |
| JP | 2003-236705 A | | 8/2003 |
| JP | 2004-001154 A | | 1/2004 |
| JP | 2006-150530 A | | 6/2006 |
| JP | 2008-168364 | * | 7/2008 |
| JP | 2009-249664 A | | 10/2009 |

OTHER PUBLICATIONS

International Search Report and Written Opinion dated Apr. 1, 2014 in PCT/JP2014/053104 filed Feb. 10, 2014.
Extended European Search Report dated Oct. 5, 2016 in Patent Application No. 14756430.6.
J. Musil, et al. "Formation of crystalline Al—Ti—O thin films and their properties" Surface & Coatings Technology 202, 2008 (pp. 6064-6069) with Cover Page.

* cited by examiner

*Primary Examiner* — Archene Turner
(74) *Attorney, Agent, or Firm* — Oblon, McClelland, Maier & Neustadt, L.L.P.

(57) ABSTRACT

Disclosed is a hard coating including a chemical composition specified by formula: $(Ti_aAl_bSi_cR_d)O_x$, where R represents at least one rare-earth element; and a, b, c, d, and x are atomic ratios respectively of Ti, Al, Si, R, and O. The atomic ratios meet conditions as specified by formulae: $0.30 \leq a \leq 0.7$, $0.30 \leq b \leq 0.70$, $0 \leq c \leq 0.2$, $0.005 \leq d \leq 0.05$, $a+b+c+d=1$, and $0.5 \leq a/b < 1$. The atomic ratios meet a condition as specified by Formula (1) when R does not include Ce. The atomic ratios meet a condition as specified by Formula (2) when R includes Ce. The hard coating has better wear resistance as compared with conventional nitride films and oxide films.

$$0.8 \leq [x/(2a+1.5b+2c+1.5d)] \leq 1.2 \quad (1)$$

$$0.8 \leq [x/(2a+1.5b+2c+2d)] \leq 1.2 \quad (2)$$

8 Claims, No Drawings

HARD COATING, METHOD FOR MANUFACTURING SAME, AND HARD-COATED ARTICLE

TECHNICAL FIELD

The present invention relates to hard coatings (hard films) and production methods thereof, and hard-coated articles that are articles, such as tools or members, coated with the hard coatings.

BACKGROUND ART

For better wear resistance of cutting tools, hard coatings such as TiN, TiCN, and TiAlN coatings are applied onto substrates of the cutting tools. The substrates are exemplified by those made typically of hard metals, cermets, and high-speed tool steels. However, further demands have been made to provide hard coatings with still better wear resistance with increasing hardness of workpieces to be cut or increasing speed of cutting operation.

Such hard coatings with excellent wear resistance are exemplified by hard coatings including oxides (oxide hard coatings). Typically, in Patent literature (PTL) 1, the applicant (assignee) of the present application proposes a coating having better wear resistance as compared with the conventional TiAlN coatings and oxide coatings. This coating includes (Ti, Al, Si)O in a predetermined compositional ratio. However, demands have still been made to provide a hard coating having better chemical stability at high ambient temperatures and having better wear resistance.

CITATION LIST

Patent Literature

PTL 1: Japanese Unexamined Patent Application Publication (JP-A) No. 2009-249664

SUMMARY OF INVENTION

Technical Problem

The present invention has been made under these circumstances, and an object thereof is to provide an oxide hard coating that has better chemical stability and better wear resistance as compared with nitride coatings and oxide coatings conventionally used as hard coatings. It is another object of the present invention to provide a method for producing the hard mating, and an article mated with the hard mating (hard-mated article).

Solution to Problem

The present invention achieves the objects and provides, in an embodiment, a hard coating to be disposed on or over a substrate, where the hard coating includes a chemical composition as specified by a formula: $(Ti_aAl_bSi_cR_d)O_x$, where R represents at least one rare-earth element; and a, b, c, d, and x are atomic ratios respectively of Ti, Al, Si, R, and O. The atomic ratios a, b, c, and d meet conditions specified by formulae $0.30 \leq a \leq 0.7$, $0.30 \leq b \leq 0.70$, $0 \leq c \leq 0.2$, $0.005 \leq d \leq 0.05$, $a+b+c+d=1$, and $0.5 \leq a/b < 1$. The atomic ratios a, b, c, d, and x meet a condition as specified by Formula (1) when R does not include Ce. The atomic ratios a, b, c, d, and x meet a condition as specified by Formula (2) when R includes Ce. Formulae (1) and (2) are expressed as follows:

$$0.8 \leq [x/(2a+1.5b+2c+1.5d)] \leq 1.2 \quad (1)$$

$$0.8 \leq [x/(2a+1.5b+2c+2d)] \leq 1.2 \quad (2).$$

The present invention also achieves the objects and provides, in another embodiment, a hard coating that is to be disposed on or over a substrate and includes a chemical composition as specified by a formula: $(Ti_aCr_eAl_bSi_cR_d)O_x$, where R represents at least one rare-earth element; and a, e, b, c, d, and x are atomic ratios respectively of Ti, Cr, Al, Si, R, and O. The atomic ratios a, b, c, d, and e meet conditions as specified by formulae $0.05 \leq a \leq 0.4$, $0.10 \leq e \leq 0.85$, $0 \leq b \leq 0.70$, $0 \leq c \leq 0.2$, $0.005 \leq d \leq 0.05$, and $a+b+c+d+e=1$. The atomic ratios a and e meet a condition as specified by formula: $a/e < 1.0$ when b is 0. The atomic ratios a, b, c, d, e, and x meet a condition as specified by Formula (3) when R does not include Ce. The atomic ratios a, b, c, d, e, and x meet a condition as specified by Formula (4) when R includes Ce. Formulae (3) and (4) are expressed as follows:

$$0.8 \leq [x/(2a+1.5e+1.5b+2c+1.5d)] \leq 1.2 \quad (3)$$

$$0.8 \leq [x/(2a+1.5e+1.5b+2c+2d)] \leq 1.2 \quad (4).$$

The present invention further includes a hard-mated article that includes a substrate, and the hard coating on or over the substrate.

In a preferred embodiment, the hard-coated article further includes an intermediate layer between the substrate and the hard coating. The intermediate layer includes a nitride containing Ti and/or Cr.

The present invention further includes a method for producing the hard coating. The production method includes preparing an atmosphere having an oxygen partial pressure of 0.5 Pa to 4 Pa, and performing cathodic arc ion plating in the atmosphere to form the hard coating.

Advantageous Effects of Invention

The present invention can provide an oxide hard coating that has still better wear resistance as compared with the conventional nitride coatings and oxide coatings. The hard coating, when formed on or over an article, allows the article to have better wear resistance. The article is exemplified by cutting tools such as tips or inserts, drills, and end mills; and jigs and tools for plastic metal working, such as tools (e.g., dies and punches) for use typically in forging, press forming, and extrusion.

DESCRIPTION OF EMBODIMENTS

To achieve the objects, the present inventors focused attention on oxide hard coatings having better chemical stability at high ambient temperatures as compared with the nitride coatings and made intensive investigations to provide a coating having better wear resistance as compared with the conventional oxide coatings. As a result, the present inventors have found that an oxide coating containing Ti and a rare-earth element, when further containing Al and Si (and still further containing Cr), can have better wear resistance as compared with the conventional hard coatings. This is because as follows. Titanium (Ti) can readily achieve high hardness and effectively contributes to better wear resistance. The rare-earth element contributes to better oxidation resistance, induces grain refinement, and thereby contributes to higher hardness. Aluminum (Al) can readily achieve high hardness and effectively contributes to better wear resistance. Silicon (Si) effectively stabilizes the coating. Chromium (Cr) can readily achieve high hardness and effectively contributes to better wear resistance. The present invention has been made based on these findings. Reasons for selecting the elements and for specifying compositional ranges of the elements in the hard coating according to the present invention will be described below.

Initially, a hard coating according to a first embodiment of the present invention will be described. This hard coating includes a chemical composition as specified by formula: $(Ti_aAl_bSi_cR_d)O_x$, where R represents at least one rare-earth element; and a, b, c, d, and x are atomic ratios respectively of Ti, Al, Si, R, and O (hereinafter the same). The atomic ratios a, b, c, and d meet conditions specified by formulae: $0.30 \leq a \leq 0.7$, $0.30 \leq b \leq 0.70$, $0 \leq c \leq 0.2$, $0.005 \leq d \leq 0.05$, $a+b+c+d=1$, and $0.5 \leq a/b < 1$. The atomic ratios a, b, c, d, and x meet a condition as specified by Formula (1) when R does not include Ce. The atomic ratios a, b, c, d, and x meet a condition as specified by Formula (2) when R includes Ce. Formulae (1) and (2) are expressed as follows:

$$0.8 \leq [x/(2a+1.5b+2c+1.5d)] \leq 1.2 \quad (1)$$

$$0.8 \leq [x/(2a+1.5b+2c+2d)] \leq 1.2 \quad (2)$$

Assume that a coating (layer) containing an aluminum oxide alone is formed as an oxide coating at a low temperature. In this case, the resulting coating becomes amorphous and hardly has high hardness at a target level. However, the oxide coating, when further containing Ti, undergoes the formation of a crystal phase to have higher hardness. To offer these effects, the Ti content (atomic ratio) "a" may be controlled to 0.30 or more, and preferably 0.40 or more. However, the hard coating, if containing Ti in a content greater than 0.7, may undergo transformation of the crystal structure into titanium oxide (rutile) and may readily have lower hardness. To prevent this, the Ti content may be controlled, in terms of upper limit, 0.7 or less, and preferably 0.60 or less.

The hard coating, if containing Al in a content "b" less than 0.30, may fail to surely have high hardness. To prevent this, the Al content is controlled to, in terms of lower limit, 0.30 or more, preferably 0.40 or more, and more preferably 0.45 or more. In contrast, the hard coating, if having an Al content greater than 0.70, may become amorphous and hardly have high hardness at a target level. To prevent this, the Al content may be controlled to, in terms of upper limit, 0.70 or less, preferably 0.60 or less, and more preferably 0.55 or less.

The hard coating, if having a Ti content higher than the Al content, may include a larger amount of $TiO_2$ and may readily have lower hardness. To prevent this, the Ti content "a" and the Al content "b" may be controlled to meet a condition as specified by: a/b<1. The ratio a/b is preferably 0.95 or less, and more preferably 0.90 or less. In contrast, the hard coating, if having an Al content greater than 2 times as much as the Ti content, may readily become amorphous and may hardly have high hardness at a target level. To prevent this, the ratio a/b may be controlled to 0.5 or more, preferably 0.60 or more, more preferably 0.70 or more, and furthermore preferably 0.80 or more.

Silicon (Si) forms silicon oxide that can be formed with smaller free energy and is more stable as compared with the titanium oxide. For this reason, the hard coating preferably contains Si so as to be a more stable oxide coating. From these viewpoints, the Si content "c" is preferably 0.03 or more, and more preferably 0.05 or more. However, the hard coating, if containing Si in excess, may readily become amorphous and may hardly have high hardness at a target level. To prevent this, the Si content may be controlled to, in terms of upper limit, 0.2 or less, and preferably 0.10 or less.

The at least one rare-earth element R may hereinafter also simply referred to as "element R". Specifically, the element R is at least one element selected from the group consisting of Sc, Y, La, Ce, Pr, Nd, Pm, Sm, Eu, Gd, Tb, Dy, Ho, Er, Tm, Yb, and Lu. The oxide coating according to the present invention contains at least one rare-earth element R, thereby has better oxidation resistance, and undergoes grain refinement to have higher hardness. The hard coating, as containing the rare-earth element R, includes grains of $Al_2O_3$ and $R_2O_3$ having different lattice constants to cause strain in the grains. This causes a lattice defect and allows the hard coating to have higher hardness. In addition, part of aluminum atoms in $Al_2O_3$ grains is replaced with the rare-earth element. This also causes strain in the grains to form a defect and thereby allows the hard coating to have higher hardness. Of the rare-earth elements, preferred are elements having an ionic radius largely different from that of Al so as to readily form strain in the $Al_2O_3$ grains. Specifically, elements of this type are exemplified by Y, La, Nd, and Ho. These elements are stable in oxide structure $R_2O_3$ and have an ionic radius of 1.0 angstrom or more.

To have the advantageous effects derived from the element R, the element R content "d" may be controlled to 0.005 or more, and preferably 0.010 or more. The "element R content" refers to the content of a rare-earth element when the element R includes the one rare-earth element alone; and refers to the total content of two or more rare-earth elements when the element R includes the two or more elements, hereinafter the same. However, the hard coating, if having an element R content greater than 0.05, may have saturated effects derived from the element R, may include excessively fine grains to become amorphous, and may readily have lower hardness. To prevent this, the element R content may be controlled to 0.05 or less, and preferably 0.03 or less.

The ratio of oxygen to the metal elements (Ti, Al, Si, and R) may vary depending on the types and ratios (proportions) of the metal elements constituting the oxide coating (hard coating). Theoretically, Ti, Al, and Si respectively form $TiO_2$, $Al_2O_3$, and $SiO_2$, and the element R generally forms $R_2O_3$, where, when the element R is Ce, Ce stably forms $CeO_2$. Assume that the elements form the stoichiometric oxides, and the element R does not include Ce in an oxide coating as specified by the formula: $(Ti_aAl_bSi_cR_d)O_x$. In this case, the ratio x equals [2a+1.5b+2c+1.5d]. Also assume that the elements form the stoichiometric oxides, and the element R includes Ce alone or in combination with one or more other rare-earth elements than Ce in the oxide coating. In this else, the ratio x equals [2a+1.5b+2c+2d]. Hereinafter the values "2a+1.5b+2c+1.5d" and "2a+1.5b+2c+2d" are also referred to as constitutive oxygen contents in the stoichiometric oxides.

The ratios of x to (2a+1.5b+2c+1.5d) and of x to (2a+1.5b+2c+2d) are theoretically 1, but may actually vary depending typically on deposition conditions. The ratios are hereinafter also synthetically referred to as a "ratio Q". An oxide coating, if having a lower oxygen content and becomes metal-rich under some deposition conditions, may readily have lower hardness. To prevent this, the atomic ratio x may be controlled herein to be 0.8 time or more as much as the constitutive oxygen content in the stoichiometric oxides. Namely, the ratio Q may be controlled to 0.8 or more. The ratio Q is preferably 0.90 or more, and more preferably 0.95 or more. In contrast, the atomic ratio x basically does not exceed the constitutive oxygen content in the stoichiometric oxides. However, in consideration typically of measurement error, the ratio Q may be controlled to, in terms of upper limit, 1.2 or less, preferably 1.10 or less, and more preferably 1.05 or less.

Next, a hard coating according to the second embodiment of the present invention will be described. This hard coating includes a chemical composition as specified by the formula: $(Ti_aCr_eAl_bSi_cR_d)O_x$, where R represents at least one rare-earth element; and a, e, b, c, d, and x represent atomic ratios respectively of Ti, Cr, Al, Si, R, and O, hereinafter the same. The atomic ratios a, b, c, d, and e meet conditions as specified by formulae: $0.05 \leq a \leq 0.4$, $0.10 \leq e \leq 0.85$, $0 \leq b \leq 0.70$, $0 \leq c \leq 0.2$, $0.005 \leq d \leq 0.05$, and $a+b+c+d+e=1$. When b is 0, $a/e<1.0$. The atomic ratios a, b, c, d, e, and x meet a condition as specified by Formula (3) when R does not include Ce. The atomic ratios a, b, c, d, e, and x meet a condition as specified by Formula (4) when R includes Ce. Formulae (3) and (4) are expressed as follows:

$$0.8 \leq [x/(2a+1.5e+1.5b+2c+1.5d)] \leq 1.2 \quad (3)$$

$$0.8 \leq [x/(2a+1.5e+1.5b+2c+2d)] \leq 1.2 \quad (4)$$

The hard coating according to the first embodiment, when further containing Cr, may include Cr—O bonds to thereby have still higher hardness. To have these effects sufficiently, the Cr content "e" may be controlled to 0.10 or more, preferably 0.15 or more, more preferably 0.20 or more, furthermore preferably 0.25 or more, and still more preferably 0.30 or more. Chromium (Cr) forms chromium oxide that has excellent wear resistance by itself. From this viewpoint, the hard coating may have a high Cr content. However, the hard coating, if having an excessively high Cr content, may have relatively low Al and Ti contents and may readily have lower hardness. To prevent this, the Cr content may be controlled to, in terms of upper limit, 0.85 or less, preferably 0.70 or less, and more preferably 0.65 or less.

To maintain high hardness, the hard coating according to the second embodiment may have an Al content "b" of preferably 0.1 or more, more preferably 0.20 or more, and furthermore preferably 0.30 or more. In contrast, the hard coating, if having an Al content greater than 0.70, may become amorphous and may hardly have high hardness at a target level. To prevent this, the Al content may be controlled to, in terms of upper limit, 0.70 or less, preferably 0.60 or less, and more preferably 0.50 or less.

The hard coating, as containing Ti, can form an oxide further including Ti and can thereby have higher hardness as compared with a hard coating containing an oxide of Cr alone or an oxide of Cr and Al. For this reason, the Ti content "a" may be controlled to 0.05 or more, preferably 0.10 or more, and more preferably 0.15 or more. However, the hard coating, if containing Ti in excess, may contrarily have lower hardness, as with the hard coating according to the first embodiment. To prevent this, the Ti content may be controlled to, in terms of upper limit, 0.4 or less, preferably 0.30 or less, and more preferably 0.20 or less.

Assume that the hard coating does not contain Al. In this case, the hard coating may readily have lower hardness if having a Ti content higher than the Cr content. To prevent this, the ratio a/e of the Ti content "a" to the Cr content "e" may be controlled to smaller than 1 (a/e<1.0) when the hard coating does not contain Al (b=0). The ratio a/e is preferably 0.8 or less, and more preferably 0.6 or less. In the hard coating according to the second embodiment, the ratio a/b of the Ti content "a" to the Al content "b" is not specified.

Silicon (Si) forms silicon oxide that can be formed with a smaller free energy and is more stable as compared with the titanium oxide. The hard coating therefore preferably contains Si so as to be a more stable oxide coating. From this viewpoint, the Si content "c" is preferably 0.03 or more, and more preferably 0.05 or more. However, the hard coating, if containing Si in excess, may readily become amorphous and may hardly have high hardness at a target level. To prevent this, the Si content may be controlled to, in terms of upper limit, 0.2 or less, and preferably 0.10 or less.

The hard coating according to the second embodiment, as containing the element R, can also have better oxidation resistance and undergoes grain refinement to have higher hardness. Specifically, the element R refers to at least one rare-earth element selected from the group consisting of Sc, Y, La, Ce, Pr, Nd, Pm, Sm, Eu, Gd, Tb, Dy, Ho, Er, Tm, Yb, and Lu. The hard coating, as containing the at least one rare-earth element, includes grains of $Al_2O_3$, $R_2O_3$, and $Cr_2O_3$ having different lattice constants to cause strain in the grains. This causes a lattice defect and allows the hard coating to have higher hardness. In addition, part of aluminum atoms in the $Al_2O_3$ grains is replaced with the rare-earth element. This also causes strain in the grains to form a defect and thereby allows the hard coating to have higher hardness. Of the rare-earth elements, preferred are elements having an ionic radius largely different from that of Al so as to readily form strain in the $Al_2O_3$ grains. Specifically, elements of this type are exemplified by Y, La, Nd, and Ho. These elements are stable the in oxide structure $R_2O_3$ and have an ionic radius of 1.0 angstrom or more.

To have the advantageous effects derived from the element R, the element R content "d" may be controlled to 0.005 or more, and preferably 0.010 or more. The "element R content" refers to the content of a rare-earth element when the element R includes the one rare-earth element alone; and refers to the total content of two or more rare-earth elements when the element R includes the two or more elements, hereinafter the same. However, the hard coating, if having an element R content greater than 0.05, may have saturated effects derived from the element R, may include excessively fine grains to become amorphous, and may readily have lower hardness. To prevent this, the element R content may be controlled to 0.05 or less, and preferably 0.03 or less.

Also in the hard coating according to the second embodiment, the ratio of oxygen to the metal elements (Ti, Cr, Al, Si, and R) may vary depending on the types and ratios (proportions) of the metal elements constituting the hard coating. Theoretically, Ti, Cr, Al, and Si respectively form $TiO_2$, $Cr_2O_3$, $Al_2O_3$, and $SiO_2$, and the element R generally forms $R_2O_3$, where, when the element R is Ce, Ce stably forms $CeO_2$. Assume that the elements form the stoichiometric oxides, and the element R does not include Ce in an oxide coating represented by the formula: $(Ti_aCr_eAl_bSi_cR_d)O_x$. In this case, the ratio x equals $[2a+1.5e+1.5b+2c+1.5d]$. Also assume that the elements form the stoichiometric oxide, and the element R includes Ce alone or in combination with one or more rare-earth elements other than Ce in the oxide coating. In this case, the ratio x equals $[2a+1.5e+1.5b+2c+2d]$. Hereinafter the values "$2a+1.5e+1.5b+2c+1.5d$" and "$2a+1.5e+1.5b+2c+2d$" are also referred to as constitutive oxygen contents in the stoichiometric oxides.

The ratios of x to $(2a+1.5e+1.5b+2c+1.5d)$ and of x to $(2a+1.5e+1.5b+2c+2d)$ are theoretically 1, but may actually vary depending typically on deposition conditions. The ratios are hereinafter also synthetically referred to as a "ratio R". An oxide coating, if having a lower oxygen content and becomes metal-rich under some deposition conditions, may readily have lower hardness. To prevent this, the atomic ratio x may be controlled herein to 0.8 time or more as much as the constitutive oxygen content in the stoichiometric oxides. Namely, the ratio R may be controlled to 0.8 or more. The ratio R is preferably 0.90 or more, and more preferably 0.95 or more. In contrast, the atomic ratio x basically does not exceed the constitutive oxygen content in the stoichiometric oxides. However, in consideration typically of measurement error, the ratio R may be controlled to, in terms of upper limit, 1.2 or less, preferably 1.10 or less, and more preferably 1.05 or less.

The hard coating according to the present invention is exemplified by a single-layer hard coating of the hard coating according to the first embodiment or the hard coating according to the second embodiment; and a multi-layered hard coating including two or more of the hard coatings. Hereinafter these hard coatings are also synthetically referred to as a "hard coating according to the present invention" or simply referred to as a "hard coating".

The hard coating according to the present invention preferably has a total thickness of from 0.05 μm to 20 μm regardless of being a single-layer or multilayered hard coating. The hard coating, if having a total thickness less than 0.05 μm, may hardly offer sufficient wear resistance. The total thickness is more preferably 0.10 μm or more, furthermore preferably 1.0 μm or more, and still more preferably 3.0 μm or more. In contrast, the hard coating, if having a total thickness greater than 20 μm, may undesirably suffer from a defect (loss) or peeling during cutting.

The present invention also includes a hard-coated article that includes a substrate, and the hard coating according to the present invention on or over the substrate. The hard coating according to the present invention may constitute at least part of the outermost surface of the hard-coated article.

The hard-coated article is exemplified by cutting tools such as tips or inserts, drills, and end mills; and jigs and tools for plastic metal working, such as tools (e.g., dies and punches) for forging, press forming, extrusion, and shearing. In particular, the hard-coated article can sufficiently exhibit advantageous effects when used as cutting tools such as inserts for use in continuous cutting; and end mills, milling cutter tips or inserts, and drills for use in intermittent cutting. The present invention is also applicable to die-casting tools and other articles to be in contact with a molten metal. The hard coating according to the present invention is also useful as wear-resistant coatings and/or melting-resistant coatings to be disposed on or over the articles.

The hard-coated article may further include an intermediate layer between the substrate and the hard coating, where the intermediate layer includes a nitride containing Ti and/or Cr. The hard coating according to the first embodiment and the hard coating according to the second embodiment include very stable compounds, have low reactivity with the substrate, and tend to have poor adhesion with the substrate. For this reason, the intermediate layer is preferably disposed between the substrate and the hard coating as described above, so as to allow the hard coating to have better adhesion to the substrate and to exhibit wear resistance over a long time. The nitride containing Ti and/or Cr for use herein is exemplified by TiN, CrN, TiCrN, TiAlN, TiCrAlN, and CrAlN. Of such intermediate layers, preferred are layers containing TiAlN for the hard coating according to the first embodiment; and layers including TiCr(Al)N for the hard coating according to the second embodiment.

The intermediate layer may include a graded-composition layer (composition-gradient layer) in which the content of nitrogen gradually decreases and the content of oxygen gradually increases in the direction from the substrate toward the hard coating. The presence of such a graded-composition layer can restrain abrupt compositional variations at the interface between the hard coating and the nitride constituting the intermediate layer and contributes to still better adhesion. The composition gradient in the graded-composition layer may be either continuous or stepwise, or either linear or curvilinear. Further, the composition gradient may monotonously vary, or resultantly unidirectionally vary in which the compositions are repetitively increase and decrease.

The intermediate layer preferably has a thickness of 0.01 μm to 5 μm. The intermediate layer, if having a thickness less than 0.01 μm, may fail to sufficiently have excellent adhesion. The intermediate layer may have a thickness of more preferably 0.10 μm or more, and furthermore preferably 1.0 μm or more. In contrast, the intermediate layer, if having a thickness greater than 5 μm, may undesirably suffer from a defect or peeling during cutting. The intermediate layer may have a thickness of more preferably 4 μm or less.

In a recommended embodiment, the hard coating according to the present invention may be formed by cathodic arc ion plating using a target in an atmosphere having an oxygen partial pressure of 0.5 Pa to 4 Pa. Deposition equipment for use herein is exemplified by equipment illustrated in FIG. 1 of PTL 1. The deposition is preferably performed in an atmosphere having an oxygen partial pressure of 0.5 Pa to 4 Pa as described above, so as to be performed stably at a high speed. The deposition, if performed at an oxygen partial pressure less than 0.5 Pa, may form an oxygen-deficient oxide coating (metal-rich oxide coating), namely, an oxide coating having a ratio Q or ratio R less than 0.8 and having low hardness. The oxygen partial pressure is preferably 1 Pa or more. In contrast, the deposition, if performed at an oxygen partial pressure greater than 4 Pa, may cause the dispersion of the gas of particles to be deposited to cause a lower deposition rate, thus being undesirable from the viewpoint of productivity. The oxygen partial pressure is preferably 2 Pa or less.

The deposition of the hard coating may be performed at a substrate temperature of preferably 500° C. or higher, and more preferably 550° C. or higher, so as to form a crystalline oxide coating. However, the deposition, if performed at an excessively high substrate temperature, may cause the substrate to deteriorate. To prevent this, the deposition may be performed at a substrate temperature of preferably 750° C. or lower, and more preferably 700° C. or lower.

When the hard-coated article further includes an intermediate layer, the intermediate layer may be formed by any method. Typically, the intermediate layer may be formed as a layer of TiN, CrN or TiAlN by arc ion plating (AIP) or sputtering using any of Ti target, a Cr target, and a TiAl target in a nitrogen atmosphere.

For better adhesion between the intermediate layer and the hard coating, the intermediate layer surface is preferably oxidized at a substrate temperature of 500° C. or higher and an oxygen partial pressure of 1 Pa or more before the deposition of the hard coating.

EXAMPLES

The present invention will be illustrated in further detail with reference to several examples (experimental examples) below. It should be noted, however, that the examples are by no means intended to limit the scope of the invention; that various changes and modifications can naturally be made therein without deviating from the spirit and scope of the invention as described herein; and all such changes and modifications should be considered to be within the scope of the invention.

Experimental Example 1

Oxide coatings having chemical compositions given in Table 1 were formed on a substrate by AIP (cathodic arc ion plating) using AIP equipment and were examined to evaluate wear resistance.

The substrate was prepared by subjecting a cutting-test-use hard-metal insert (SNMA 120408) to ultrasonic degreasing in ethanol. The substrate was placed in the equipment, and, after evacuation to $5\times10^{-3}$ Pa, was heated up to 550° C. and etched with Ar ions.

Next, a TiAlN layer about 3 μm thick was initially formed as an intermediate layer on the substrate. The TiAlN layer was formed by introducing nitrogen gas to 4 Pa, preparing a TiAl target having a diameter of 100 mm and being attached to an arc evaporation source, and performing AIP as cathodic arc ion plating at a discharge current of 150 A and a bias voltage applied to the substrate of −30 V.

Next, an oxide coating having a chemical composition as given in Table 1 and having a thickness of about 5 μm was deposited on the intermediate layer surface. The oxide coating was formed by preparing a target having a metal composition corresponding to the oxide coating, introducing oxygen to an oxygen partial pressure of 1.3 Pa, and performing arc discharge by AIP (cathodic arc ion plating) at a current of 150 A. To the substrate, a pulsed bias voltage of −100 V was applied at a frequency of 30 kHz and a duty ratio of 75% for the oxide mating formation. A sample bearing a TiAlN layer having a thickness of about 5 μm alone on the substrate without the deposition of an oxide coating was prepared as a comparative example (Sample No. 1 in Table 1).

Each of the prepared samples was subjected to a cutting test under conditions below, in which a flank wear amount was measured to evaluate wear resistance. A sample having a flank wear amount less than 200 was evaluated as having excellent wear resistance. The flank wear amount is preferably 180 μm or less, and more preferably 160 μm or less. The measurement results are indicated in Table 1.

Cutting Test Conditions
Workpiece: FCD 500 (not heat-treated)
Cutting speed: 300 m/minute
Depth of cut: 2 mm
Feed rate: 0.25 mm/blade
Lubrication: wet (emulsion)
Cutting time: 6 minutes
Performance index: flank wear amount

TABLE 1

| No. | Metal element in oxide coating (atomic ratio) | | | | | | a/b | a/e (when Al content is zero) | Oxygen content x | Constitutive oxygen content in stoichiometric oxides | Ratio Q or ratio R | Wear amount (mm) |
|---|---|---|---|---|---|---|---|---|---|---|---|---|
| | Ti (a) | Cr (e) | Al (b) | Si (c) | R (d) | | | | | | | |
| 1 | 0.40 | 0 | 0.60 | 0 | 0 | 0 | 0.67 | — | — | — | — | 230 |
| 2 | 0.25 | 0 | 0.74 | 0 | Y | 0.01 | 0.34 | — | 1.74 | 1.63 | 1.07 | 230 |
| 3 | 0.30 | 0 | 0.69 | 0 | Y | 0.01 | 0.43 | — | 1.69 | 1.65 | 1.02 | 200 |
| 4 | 0.40 | 0 | 0.59 | 0 | Y | 0.01 | 0.68 | — | 1.7 | 1.70 | 1.00 | 165 |
| 5 | 0.49 | 0 | 0.50 | 0 | Y | 0.01 | 0.98 | — | 1.65 | 1.75 | 0.95 | 185 |
| 6 | 0.70 | 0 | 0.29 | 0 | Y | 0.01 | 2.41 | — | 1.78 | 1.85 | 0.96 | 210 |
| 7 | 0.45 | 0 | 0.50 | 0.03 | La | 0.02 | 0.90 | — | 1.73 | 1.74 | 0.99 | 160 |
| 8 | 0.40 | 0 | 0.48 | 0.10 | La | 0.02 | 0.83 | — | 1.74 | 1.75 | 0.99 | 165 |
| 9 | 0.38 | 0 | 0.40 | 0.20 | La | 0.02 | 0.95 | — | 1.7 | 1.79 | 0.95 | 185 |
| 10 | 0.30 | 0 | 0.38 | 0.30 | Y | 0.02 | 0.79 | — | 1.8 | 1.80 | 1.00 | 200 |
| 11 | 0.45 | 0 | 0.50 | 0.05 | 0 | 0 | 0.90 | — | 1.78 | 1.75 | 1.02 | 205 |
| 12 | 0.45 | 0 | 0.495 | 0.05 | Y | 0.005 | 0.91 | — | 1.74 | 1.75 | 0.99 | 180 |
| 13 | 0.43 | 0 | 0.51 | 0.05 | Y | 0.01 | 0.84 | — | 1.75 | 1.74 | 1.01 | 155 |
| 14 | 0.43 | 0 | 0.51 | 0.03 | Y | 0.03 | 0.84 | — | 1.75 | 1.73 | 1.01 | 140 |
| 15 | 0.43 | 0 | 0.49 | 0.03 | Y | 0.05 | 0.88 | — | 1.72 | 1.73 | 0.99 | 145 |
| 16 | 0.43 | 0 | 0.45 | 0.05 | Y | 0.07 | 0.96 | — | 1.7 | 1.74 | 0.98 | 205 |
| 17 | 0.43 | 0 | 0.51 | 0.03 | Ho | 0.03 | 0.84 | — | 1.68 | 1.73 | 0.97 | 165 |
| 18 | 0.43 | 0 | 0.51 | 0.03 | Nd | 0.03 | 0.84 | — | 1.7 | 1.73 | 0.98 | 170 |
| 19 | 0.25 | 0.05 | 0.69 | 0 | Y | 0.01 | — | — | 1.66 | 1.63 | 1.02 | 210 |
| 20 | 0.25 | 0.10 | 0.64 | 0 | Y | 0.01 | — | — | 1.68 | 1.63 | 1.03 | 190 |
| 21 | 0.25 | 0.15 | 0.59 | 0 | Y | 0.01 | — | — | 1.72 | 1.63 | 1.06 | 180 |
| 22 | 0.20 | 0.50 | 0.29 | 0 | Y | 0.01 | — | — | 1.62 | 1.60 | 1.01 | 170 |
| 23 | 0.10 | 0.70 | 0.19 | 0 | Y | 0.01 | — | — | 1.6 | 1.55 | 1.03 | 185 |
| 24 | 0.03 | 0.90 | 0.06 | 0 | Y | 0.01 | — | — | 1.55 | 1.52 | 1.02 | 215 |
| 25 | 0.01 | 0.20 | 0.70 | 0.08 | Y | 0.01 | — | — | 1.54 | 1.55 | 1.00 | 205 |
| 26 | 0.05 | 0.55 | 0.35 | 0 | Y | 0.05 | — | — | 1.55 | 1.53 | 1.02 | 190 |
| 27 | 0.10 | 0.50 | 0.35 | 0 | Y | 0.05 | — | — | 1.55 | 1.55 | 1.00 | 175 |
| 28 | 0.20 | 0.40 | 0.35 | 0 | Y | 0.05 | — | — | 1.58 | 1.60 | 0.99 | 160 |
| 29 | 0.30 | 0.30 | 0.35 | 0 | Y | 0.05 | — | — | 1.6 | 1.65 | 0.97 | 165 |
| 30 | 0.40 | 0.20 | 0.35 | 0 | Y | 0.05 | — | — | 1.66 | 1.70 | 0.98 | 185 |
| 31 | 0.50 | 0.20 | 0.25 | 0 | Y | 0.05 | — | — | 1.72 | 1.75 | 0.98 | 200 |
| 32 | 0.40 | 0.35 | 0 | 0.20 | Y | 0.05 | — | 1.14 | 1.78 | 1.80 | 0.99 | 210 |
| 33 | 0.25 | 0.70 | 0 | 0 | Y | 0.05 | — | 0.36 | 1.6 | 1.63 | 0.98 | 190 |
| 34 | 0.15 | 0.70 | 0.10 | 0 | Y | 0.05 | — | — | 1.6 | 1.58 | 1.02 | 175 |
| 35 | 0.15 | 0.60 | 0.20 | 0 | Y | 0.05 | — | — | 1.58 | 1.58 | 1.00 | 160 |
| 36 | 0.15 | 0.30 | 0.50 | 0 | Y | 0.05 | — | — | 1.55 | 1.58 | 0.98 | 155 |
| 37 | 0.15 | 0.20 | 0.50 | 0 | Y | 0.05 | — | — | 1.52 | 1.58 | 0.97 | 165 |
| 38 | 0.10 | 0.15 | 0.70 | 0 | Y | 0.05 | — | — | 1.5 | 1.55 | 0.97 | 185 |
| 39 | 0.10 | 0.15 | 0.74 | 0 | Y | 0.01 | — | — | 1.58 | 1.55 | 1.01 | 205 |
| 40 | 0.15 | 0.30 | 0.50 | 0.03 | Y | 0.02 | — | — | 1.55 | 1.59 | 0.97 | 155 |
| 41 | 0.15 | 0.30 | 0.43 | 0.10 | Y | 0.02 | — | — | 1.6 | 1.63 | 0.98 | 165 |

TABLE 1-continued

| | Metal element in oxide coating (atomic ratio) | | | | | | a/b | a/e (when Al content is zero) | Oxygen content x | Constitutive oxygen content in stoichiometric oxides | Ratio Q or ratio R | Wear amount (mm) |
|---|---|---|---|---|---|---|---|---|---|---|---|---|
| No. | Ti (a) | Cr (e) | Al (b) | Si (c) | R (d) | | | | | | | |
| 42 | 0.15 | 0.30 | 0.33 | 0.20 | Y | 0.02 | — | — | 1.64 | 1.68 | 0.98 | 170 |
| 43 | 0.40 | 0.15 | 0.10 | 0.30 | Y | 0.05 | — | — | 1.88 | 1.85 | 1.02 | 215 |
| 44 | 0.15 | 0.30 | 0.50 | 0.05 | 0 | 0 | — | — | 1.54 | 1.60 | 0.96 | 200 |
| 45 | 0.15 | 0.30 | 0.495 | 0.05 | Y | 0.005 | — | — | 1.58 | 1.60 | 0.99 | 165 |
| 46 | 0.15 | 0.30 | 0.49 | 0.05 | Y | 0.01 | — | — | 1.6 | 1.60 | 1.00 | 135 |
| 47 | 0.15 | 0.30 | 0.47 | 0.05 | Y | 0.03 | — | — | 1.7 | 1.60 | 1.06 | 110 |
| 48 | 0.15 | 0.30 | 0.45 | 0.05 | Y | 0.05 | — | — | 1.58 | 1.60 | 0.99 | 140 |
| 49 | 0.15 | 0.30 | 0.43 | 0.05 | Y | 0.07 | — | — | 1.55 | 1.60 | 0.97 | 205 |
| 50 | 0.15 | 0.30 | 0.47 | 0.05 | Ho | 0.03 | — | — | 1.62 | 1.60 | 1.01 | 155 |
| 51 | 0.15 | 0.30 | 0.47 | 0.05 | Nd | 0.03 | — | — | 1.58 | 1.60 | 0.99 | 160 |

Table 1 indicates as follows. Sample Nos. 4, 5, 7 to 9, 12 to 15, 17, 18, 20 to 23, 26 to 30, 33 to 38, 40 to 42, 45 to 48, 50, and 51 are samples bearing an oxide coating (hard coating) having a chemical composition meeting the conditions as specified in the present invention and had excellent wear resistance as compared with the sample bearing the TiAlN coating. In contrast, samples of the other numbers are samples each bearing an oxide coating having a chemical composition not meeting the conditions specified in the present invention and had poor wear resistance.

Specifically, Sample No. 1 bore a conventional nitride coating and was worn in a large amount. Sample No. 2 contained Ti in an insufficient content and Al in an excessively high content and had a ratio (a/b) of the Ti content to the Al content of lower than the specific range; and Sample No. 3 had a ratio (a/b) of the Ti content to the Al content of lower than the specific range. Both the samples were worn in large amounts.

Sample No. 6 contained Al in an insufficient content, had a ratio (a/b) of the Ti content to the Al content of greater than the specific range, and was worn in a large amount.

Sample No. 10 and Sample No. 43 contained Si in an excessively high content and were worn in a large amount.

Sample No. 11 did not contain any element R and corresponds to the (Ti,Al,Si)O coating film disclosed in PTL 1. Sample No. 44 also did not contain any element R. Both of these samples were worn in large amounts. In contrast, Sample No. 16 and Sample No. 49 contained the element R in an excessively high content and had poor wear resistance.

Sample No. 19 contained Cr in an insufficient content. Sample No. 24 contained Ti in an insufficient content and Cr in an excessively high content. Sample No. 25 contained Ti in an insufficient content. Sample No. 31 contained Ti in an excessively high content. Each of these samples had poor wear resistance.

Sample No. 32 did not contain Al, had a ratio (a/e) of the Ti content to the Cr content of greater than the specified upper limit, and was worn in a large amount.

Sample No. 39 contained Al in an excessively high content and had poor wear resistance.

Experimental Example 2

Next, a TiAlN layer was formed as an intermediate layer on a substrate, and a series of $(Ti_{0.45}Al_{0.49}Si_{0.03}Y_{0.03})O_x$ coatings (a/b=0.92) having different atomic ratios x or a series of $(Ti_{0.15}Cr_{0.3}Al_{0.47}Si_{0.05}Y_{0.03})O_x$ coatings having different atomic ratios x was formed on the intermediate layer. The resulting samples were examined to evaluate how the ratio Q or the ratio R affects the wear resistance. In the above formulae, a numerical value at the lower right of an element name represents an atomic ratio; hereinafter the same.

The substrate was prepared by subjecting a cutting-test-use hard-metal insert (SNMA 120408) to ultrasonic degreasing in ethanol. The substrate was placed in the equipment, and, after evacuation to $5\times10^{-3}$ Pa, was heated up to 550° C. and etched with Ar ions.

Next, a TiAlN layer about 3 μm thick was formed as an intermediate layer on the substrate, as in Experimental Example 1. Next, an oxide coating was formed on the intermediate layer surface by arc discharge according to AIP. The AIP was performed at different oxygen partial pressures in the range of from 0.2 to 4 Pa at a current of 150 A. The oxide coating was formed as a $(Ti_{0.45}Al_{0.49}Si_{0.03}Y_{0.03})O_x$ coating having a thickness of about 5 μm using a target having a chemical composition of $Ti_{0.45}Al_{0.49}Si_{0.03}Y_{0.03}$; or formed as a $(Ti_{0.15}Cr_{0.3}Al_{0.47}S_{0.05}Y_{0.03})O_x$ coating having a thickness of about 5 μm using a target having a chemical composition of $Ti_{0.15}Cr_{0.3}Al_{0.47}Si_{0.05}Y_{0.03}$. To the substrate, a pulsed bias voltage of −100 V was applied at a frequency of 30 kHz and a duty ratio of 75% for the oxide coating formation.

The samples bearing the oxide coatings on the cutting-test-use hard-metal insert were examined to evaluate wear resistance as in Experimental Example 1. The measurement results are indicated in Table 2.

TABLE 2

| | Metal element in oxide coating (atomic ratio) | | | | | | Oxygen partial pressure Pa | Oxygen content x | Constitutive oxygen content in stoichiometric oxides | Ratio Q or ratio R | Wear amount (μm) |
|---|---|---|---|---|---|---|---|---|---|---|---|
| No. | Ti | Cr | Al | Si | R (d) | | | | | | |
| 1 | 0.45 | 0 | 0.49 | 0.03 | Y | 0.03 | 0.2 | 0.5 | 1.74 | 0.29 | 310 |
| 2 | 0.45 | 0 | 0.49 | 0.03 | Y | 0.03 | 0.3 | 1 | 1.74 | 0.57 | 280 |
| 3 | 0.45 | 0 | 0.49 | 0.03 | Y | 0.03 | 0.5 | 1.39 | 1.74 | 0.80 | 180 |

TABLE 2-continued

| | Metal element in oxide coating (atomic ratio) | | | | | Oxygen partial pressure Pa | Oxygen content x | Constitutive oxygen content in stoichiometric oxides | Ratio Q or ratio R | Wear amount (μm) |
|---|---|---|---|---|---|---|---|---|---|---|
| No. | Ti | Cr | Al | Si | R (d) | | | | | |
| 4 | 0.45 | 0 | 0.49 | 0.03 | Y 0.03 | 1 | 1.75 | 1.74 | 1.01 | 140 |
| 5 | 0.45 | 0 | 0.49 | 0.03 | Y 0.03 | 4 | 1.72 | 1.74 | 0.99 | 150 |
| 6 | 0.15 | 0.3 | 0.47 | 0.05 | Y 0.03 | 0.2 | 0.55 | 1.6 | 0.34 | 290 |
| 7 | 0.15 | 0.3 | 0.47 | 0.05 | Y 0.03 | 0.3 | 0.96 | 1.6 | 0.60 | 260 |
| 8 | 0.15 | 0.3 | 0.47 | 0.05 | Y 0.03 | 0.5 | 1.35 | 1.6 | 0.84 | 170 |
| 9 | 0.15 | 0.3 | 0.47 | 0.05 | Y 0.03 | 1 | 1.6 | 1.6 | 1.00 | 110 |
| 10 | 0.15 | 0.3 | 0.47 | 0.05 | Y 0.03 | 4 | 1.55 | 1.6 | 0.97 | 135 |

Table 2 indicates and demonstrates as follows. Specifically, Sample Nos. 3 to 5 and Sample Nos. 8 to 10 had a ratio Q or ratio R within the range specified in the present invention, were worn in small amounts, and had excellent wear resistance. In contrast, Sample Nos. 1, 2, 6 and 7 had a ratio Q or ratio R of lower than the lower limit specified in the present invention and bore metal-rich oxide coatings, and had poor wear resistance.

While the present invention has been particularly described with reference to specific embodiments thereof, it is obvious to those skilled in the art that various changes and modifications may be made without departing from the spirit and scope of the present invention.

The present application claims priority to Japanese Patent Application No. 2013-037449 filed on Feb. 27, 2013, the entire contents of which are incorporated herein by reference.

INDUSTRIAL APPLICABILITY

The present invention can provide better wear resistance of articles including cutting tools such as tips or inserts, drills, and end mills; and jigs and tools for plastic metal working, such as tools (e.g., dies and punches) for use typically in forging, press forming, and extrusion.

The invention claimed is:

1. A hard coating to be disposed on or over a substrate, the hard coating comprising a chemical composition as specified by a formula:

$$(Ti_aAl_bSi_cR_d)O_x,$$

where R represents at least one rare-earth element; and a, b, c, d, and x are atomic ratios respectively of Ti, Al, Si, R, and O, wherein the atomic ratios a, b, c, and d meet conditions specified by formulae:

$$0.30 \le a \le 0.7;$$

$$0.30 \le b \le 0.70;$$

$$0 \le c \le 0.2;$$

$$0.005 \le d \le 0.05;$$

$$a+b+c+d=1; \text{ and}$$

$$0.5 \le a/b < 1,$$

wherein the atomic ratios a, b, c, d, and x meet a condition as specified by Formula (1) when R does not comprise Ce, and wherein the atomic ratios a, b, c, d, and x meet a condition as specified by Formula (2) when R comprises Ce, where Formulae (1) and (2) are expressed as follows:

$$0.8 \le [x/(2a+1.5b+2c+1.5d)] \le 1.2 \quad (1)$$

$$0.8 \le [x/(2a+1.5b+2c+2d)] \le 1.2 \quad (2).$$

2. A hard-coated article comprising:
a substrate; and
the hard coating according to claim 1.

3. The hard-coated article according to claim 2, further comprising
an intermediate layer between the substrate and the hard coating, the intermediate layer comprising a nitride comprising at least one of Ti and Cr.

4. A method for producing the hard coating according to claim 1, the method comprising:
preparing an atmosphere having an oxygen partial pressure of 0.5 Pa to 4 Pa; and
performing cathodic arc ion plating in the atmosphere to form the hard coating.

5. A hard coating to be disposed on or over a substrate, the hard coating comprising a chemical composition as specified by a formula:

$$(Ti_aCr_eAl_bSi_cR_d)O_x,$$

where R represents at least one rare-earth element; and a, e, b, c, d, and x are atomic ratios respectively of Ti, Cr, Al, Si, R, and O, wherein the atomic ratios a, b, c, d, and e meet conditions as specified by formulae:

$$0.05 \le a \le 0.4;$$

$$0.10 \le e \le 0.85;$$

$$0 \le b \le 0.70;$$

$$0 \le c \le 0.2;$$

$$0.005 \le d \le 0.05; \text{ and}$$

$$a+b+c+d+e=1,$$

wherein, when b is 0, the atomic ratios a and e meet a condition as specified by formula:

$$a/e < 1.0,$$

wherein the atomic ratios a, b, c, d, e, and x meet a condition as specified by Formula (3) when R does not comprise Ce, and wherein the atomic ratios a, b, c, d, e, and x meet a condition as specified by Formula (4) when R comprises Ce, where Formulae (3) and (4) are expressed as follows:

$$0.8 \leq [x/(2a+1.5e+1.5b+2c+1.5d)] \leq 1.2 \quad (3)$$

$$0.8 \leq [x/(2a+1.5e+1.5b+2c+2d)] \leq 1.2 \quad (4).$$

6. A hard-coated article comprising:
a substrate; and
the hard coating according to claim 5.

7. The hard-coated article according to claim 6, further comprising
an intermediate layer between the substrate and the hard coating, the intermediate layer comprising a nitride comprising at least one of Ti and Cr.

8. A method for producing the hard coating according to claim 5, the method comprising:
preparing an atmosphere having an oxygen partial pressure of 0.5 Pa to 4 Pa; and
performing cathodic arc ion plating in the atmosphere to form the hard coating.

* * * * *